(12) United States Patent
Yang

(10) Patent No.: US 11,592,474 B2
(45) Date of Patent: Feb. 28, 2023

(54) FUNCTIONAL TEST EQUIPMENT INCLUDING RELAY SYSTEM AND TEST METHOD USING THE FUNCTIONAL TEST EQUIPMENT

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 277 days.

(21) Appl. No.: 17/035,028

(22) Filed: Sep. 28, 2020

(65) Prior Publication Data

US 2022/0099732 A1 Mar. 31, 2022

(51) Int. Cl.
*G01R 31/28* (2006.01)
*G01R 31/327* (2006.01)

(52) U.S. Cl.
CPC ..... *G01R 31/2879* (2013.01); *G01R 31/2834* (2013.01); *G01R 31/3278* (2013.01)

(58) Field of Classification Search
CPC ............ G01R 31/2879; G01R 31/2834; G01R 31/3278
USPC ........................................................ 324/537
See application file for complete search history.

(56) References Cited

U.S. PATENT DOCUMENTS

| 5,943,632 A | * | 8/1999 | Edens | ................. G01N 27/9046 702/38 |
| 2017/0307688 A1 | * | 10/2017 | Trainer | ................ H02M 7/4835 |
| 2019/0378590 A1 | * | 12/2019 | Joo | .................. G01R 31/31905 |

FOREIGN PATENT DOCUMENTS

| CN | 104237583 A | 12/2014 |
| JP | 2008107255 A | 5/2008 |
| TW | I428617 B | 3/2014 |
| TW | I704363 B | 9/2020 |

* cited by examiner

*Primary Examiner* — Farhana A Hoque
(74) *Attorney, Agent, or Firm* — Muncy, Geissler, Olds & Lowe, P.C.

(57) ABSTRACT

The present disclosure provides functional test equipment for a device under test and method of testing the device under test. The functional test equipment includes a first power supply, a second power supply and a relay system. The first power supply is configured to generate a first supply voltage. The second power supply is configured to generate a second supply voltage different from the first supply voltage. The relay system is configured to electrically couple the first power supply or the second power supply to the device under test, wherein the first supply voltage is applied to the device under test for a first duration and the second supply voltage is applied to the device under test for a second duration less than the first duration.

9 Claims, 15 Drawing Sheets

FUNCTIONAL TEST EQUIPMENT INCLUDING RELAY SYSTEM AND TEST METHOD USING THE FUNCTIONAL TEST EQUIPMENT

TECHNICAL FIELD

The present disclosure relates to a functional test equipment and a method of testing a device under test using the functional test equipment, more particularly, to a functional test equipment including a relay system and a test method using the functional test equipment.

DISCUSSION OF THE BACKGROUND

Electronic devices have become extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user-programmed phone numbers and configurations when the power is turned off.

As non-volatile memories become larger, denser and more complex, testers must be able to handle the increased size and complexity without significantly increasing the time it takes to test them. Many memory testers run continuously, and testing time is considered a major factor in the cost of the finished product. As memory technology evolve and improve, the tester must be able to easily accommodate changes made to the device. Another issue specific to testing non-volatile memories is that repeated writes to cells of a memory can degrade the overall lifetime performance of the part. Non-volatile memory manufacturers have responded to many of the testing issues by building special test modes into the memory devices. These test modes are not used by the purchaser of the memory, but may be accessed by the manufacturer to test all or significant portions of the memory in as little time as possible and as efficiently as possible. Some non-volatile memories are also capable of being repaired during the test process. The tester, therefore, should be able to identify: a need for a repair, a location of the repair, and the type of repair needed; in addition, the tester must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based on an expected response from the device.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a functional test equipment for a device under test. The functional test equipment comprises a first power supply, a second power supply and a relay system. The first power supply is configured to generate a first supply voltage. The second power supply is configured to generate a second supply voltage different from the first supply voltage. The relay system is configured to electrically couple the first power supply or the second power supply to the device under test, wherein the first supply voltage is applied to the device under test for a first duration and the second supply voltage is applied to the device under test for a second duration less than the first duration.

In some embodiments, the functional test equipment is provided with a plurality of data lines, a plurality of address lines and a plurality of control lines to be electrically coupled to the device under test.

In some embodiments, the relay system comprises a relay comprised of a relay switch and a magnetizing coil magnetically coupled to the relay switch, and a microcontroller configured to control operations of the relay switch.

In some embodiments, the relay system further comprises a power source and a control switch interposed between the power source and the magnetizing coil, wherein the microcontroller is configured to close or open the control switch to control the operation of the relay switch.

In some embodiments, the microcontroller is configured to control a first interval of an off state of the control switch and a second interval of an on state of the control switch.

In some embodiments, the functional test equipment further comprises a power management capacitor. One terminal of the power management capacitor is electrically connected to the relay switch and the device under test, and the other terminal of the power management capacitor is grounded, wherein the power management capacitor is charged by the first supply voltage when the relay system couples the first power supply to the device under test, the power management capacitor is charged by the second supply voltage when the relay system couples the second power supply to the device under test, and the power management capacitor discharges to power the device under test when the relay system does not couple the first power supply or the second power supply to the device under test.

In some embodiments, the relay switch comprises a common contact electrically connected to the device under test, a normally-closed contact electrically connected to the first power supply, a normally-open contact electrically connected to the second power supply, and a switch arm, wherein the switch arm is spring-loaded by the common contact and connects the common contact to the normally-closed contact.

In some embodiments, the first supply voltage is applied to the device under test when the switch arm connects the common contact to the normally-closed contact.

In some embodiments, the second supply voltage is applied to the device under test when the switch arm connects the common contact to the normally-open contact.

In some embodiments, the power management capacitor is charged by the first power supply when the switch arm connects the common contact to the normally-closed contact, and the power management capacitor is charged by the second power supply when the switch arm connects the common contact to the normally-open contact.

In some embodiments, the power management capacitor discharges to power the device under test when the switch arm does not connect the common contact to either the normally-closed contact or the normally-open contact.

In some embodiments, the power management capacitor has a capacitance of between 20 microfarads and 220 microfarads.

Another aspect of the present disclosure provides a method of testing a device under test. The method comprises steps of coupling the device under test to a functional test equipment comprising a first power supply, a second power supply, a power management capacitor, and a relay switch coupled to the device under test, wherein the first power supply is employed to provide a first voltage and the second power supply is employed to provide a second voltage different from the first voltage; operating the relay switch in a first closed state to apply the first power supply to the device under test; and operating the relay switch in a second closed state to apply the second power supply to the device under test, wherein the first supply voltage is applied to the device under test for a first duration and the second supply voltage is applied to the device under test for a second duration less than the first duration.

In some embodiments, the method further comprises steps of charging the power management capacitor with the first voltage while the relay switch is operated in the first closed state; charging the power management capacitor with the second voltage while the relay switch is operated in the second closed state; and discharged the power management capacitor to the device under test when the relay switch is operated in an open state.

In some embodiments, a third duration that the relay switch is operated in the open state is less than the first duration.

In some embodiments, the third duration is less than the second duration.

In some embodiments, the relay switch is operated in the open state when the device under test is not powered by the first voltage or the second voltage.

In some embodiments, the relay switch switches from the first closed state to the second closed state via the open state, and the relay switch switches from the second closed state to the first closed state via the open state.

In some embodiments, the first duration and the second duration are controlled by a microcontroller coupled to a relay comprising the relay switch and a magnetizing coil magnetically coupled to the relay switch.

The testing of devices is of great importance. Conventional automatic testing equipment (ATE) cannot accurately reflect voltage variation in the power supply input to the device under test because the ATE generally provides a relatively stable power supply compared to the power supply provided to the devices installed in electronics such as computers or mobile phones. Therefore, conventional ATE is unable to screen out problematic devices under test at the stage of verification. The present disclosure provides a functional test equipment including a relay system and a pair of power supplies. In addition, the pair of power supplies provides a pair of different supply voltages to a device under test (DUT) placed in the functional test equipment. The combination of the relay system and the pair of power supplies provides a test to the DUT to simulate situations a memory chip may encounter in actual use. Moreover, artificial drops of power supplied to the DUT are made to verify the robustness of the DUT. Therefore, a more realistic simulation when the DUT is being tested can be realized according to the present disclosure.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
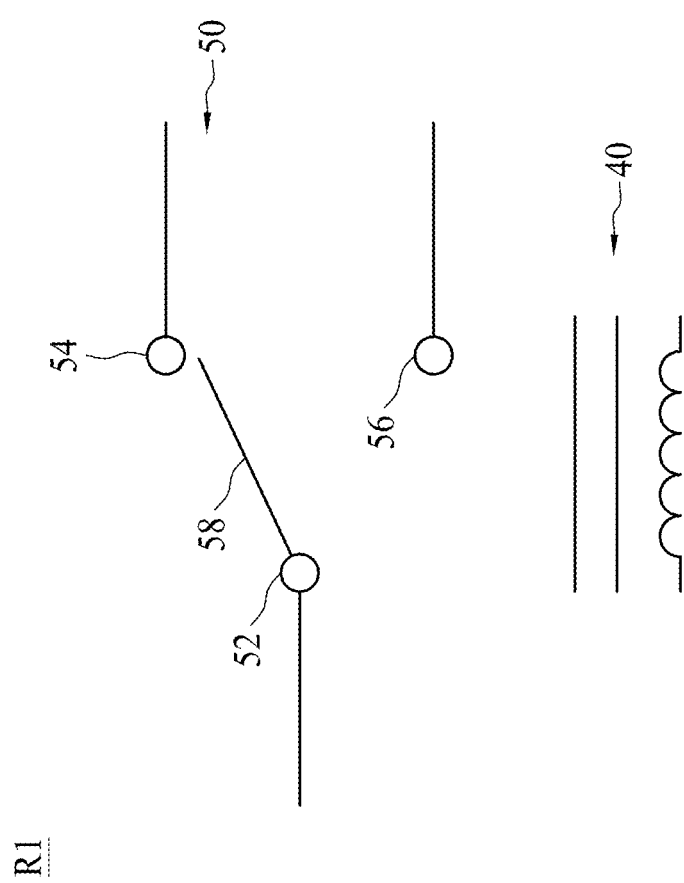
FIG. 1 is a schematic diagram illustrating a single-pole-double-throw (SPDT) type switch, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of some embodiments apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A relay is an electrically-operated switch used to control a circuit based on an independent signal input into the relay. Relays are one of the most significant electronic components because they allow low-power electronics such as computers or microcontrollers to control high-power devices such as industrial machinery. An operating principle of the relay of the present disclosure is described in detail below. Each relay basically consists of a coil and a switch. Relays have various configurations, based on the type of switch included therein.

FIG. 1 is a schematic diagram illustrating a single-pole-double-throw (SPDT) type switch, in accordance with some embodiments of the present disclosure. Referring to FIG. 1, a relay R1 including a coil 40 and an SPDT-type switch 50 is shown. The SPDT-type switch 50 includes a common (COM) contact 52, a normally-closed (NC) contact 54, a normally-open (NO) contact 56 and a switch arm 58, which is spring-loaded by the COM contact 52. The switch arm 58 may selectively connect the COM contact 52 to the NC contact 54 or the NO contact 56.

Synchronous dynamic random-access memory (SDRAM) is a new type of memory device that mainly uses a synchronous clock to control input and output signals of the memory. Computing devices utilize various types of SDRAM, such as double data rate (DDR) SDRAM. DDR SDRAM is a kind of DRAM that can support double data rate, i.e., transferring data on both the rising and falling edges of the DQ data strobe (DQS) signal to increase data rates. With the advance of technology, the capacity of DDR SDRAM devices in computing devices has increased significantly. Earlier DDR SDRAMs are retroactively referred to as DDRx SDRAMs. The DDR SDRAMs have evolved into DDR2, DDR3 and even DDR4 SDRAMs, in which data rates have increased from 333/400 MHz of DDR to 800 MHz of DDR2 and more than 1333 MHz of DDR3, with even higher data rates anticipated in the near future. Newer memory devices use relatively new standards. For example, DDR4 SDRAM uses a lower supply voltage and greater bandwidth than DDR3 or DDR2 SDRAM. Due to inconsistencies in voltage standards and physical interfaces, the different standards are not compatible with each other. In addition, as frequency increases, testers having high testing speed should be prepared to test the corresponding memory accordingly.

In semiconductor tests, a device under test (DUT) is a manufactured device undergoing testing, either during its manufacture or later during its life cycle as a part of ongoing functional tests and calibration checks. The DUT may be mounted on a landing site in an automatic test equipment (ATE) and connected to the ATE via a connection system. The ATE applies power to the DUT, supplies stimulus signals, and then measures or evaluates the resulting outputs from the device. In this way, the ATE determines whether the particular device under test meets device specifications. In general, the ATE includes various test fixtures that are specially designed according to different test demands or purposes.

Figure 2:
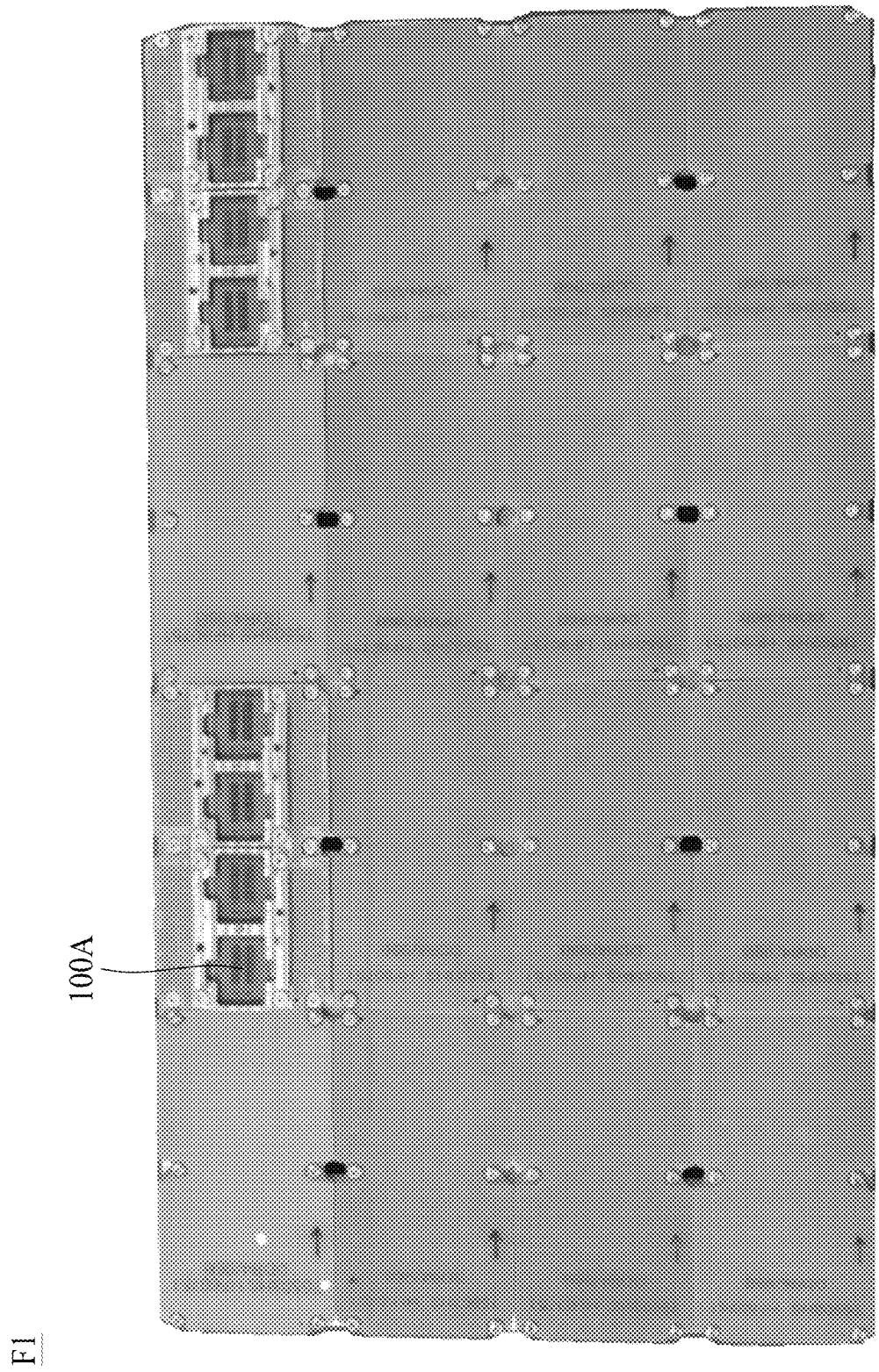
FIG. 2 is a picture of a test fixture, in accordance with some embodiments of the present disclosure.

FIG. 2 is a picture of a test fixture F1, in accordance with some embodiments of the present disclosure. In some embodiments, the test fixture F1 may be designed to have at most sixty-four landing sites 100A, each of which may accommodate one DUT for test purposes. In FIG. 2, eight landing sites 100A are installed on the test fixture F1.

Figure 3:
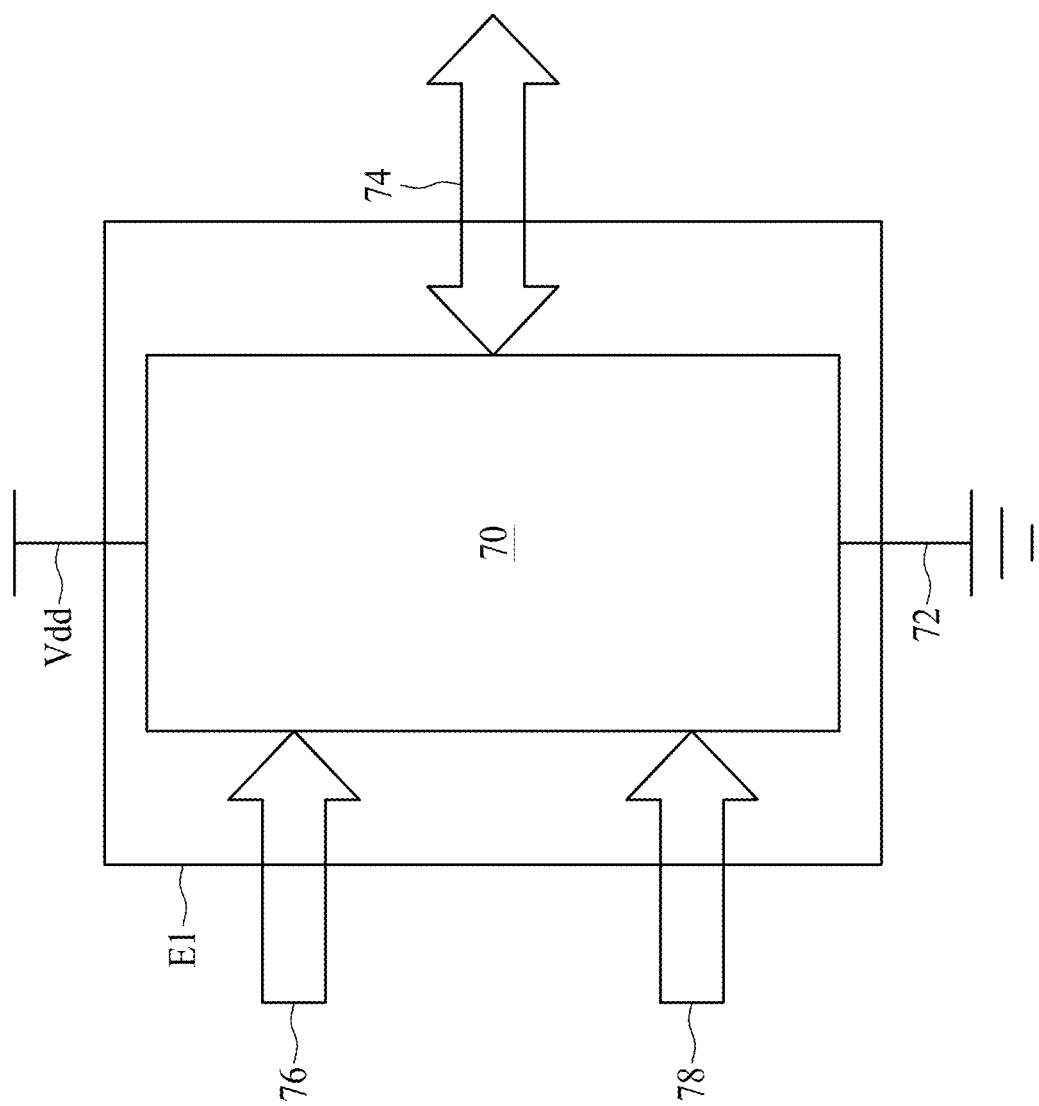
FIG. 3 is a schematic diagram showing a test equipment, in accordance with some embodiments of the present disclosure.

FIG. 3 is a schematic diagram showing a test equipment E1, in accordance with some embodiments of the present disclosure. In some embodiments, the test equipment E1 may be an ATE. In some embodiments, the test equipment E1 may provide a test supply voltage Vdd. In addition, the test equipment E1 is provided with a ground line 72, a plurality of data lines 74, a plurality of address lines 76 and a plurality of control lines 78. In some embodiments, when a DUT 70 needs to be tested, the DUT 70 may be placed in the test equipment E1 and electrically coupled to the test supply voltage Vdd, the ground line 72, the data lines 74, the address lines 76 and the control lines 78 during the test. In some embodiments, the DUT 70 may be a memory chip such as a DDRx SDRAM. Generally, when the DUT 70 is being tested, the test supply voltage Vdd provided by the test equipment E1 is exclusively used in the test process. Therefore, the test supply voltage Vdd applied to the DUT 70 is a relatively stable power supply.

Figure 4:
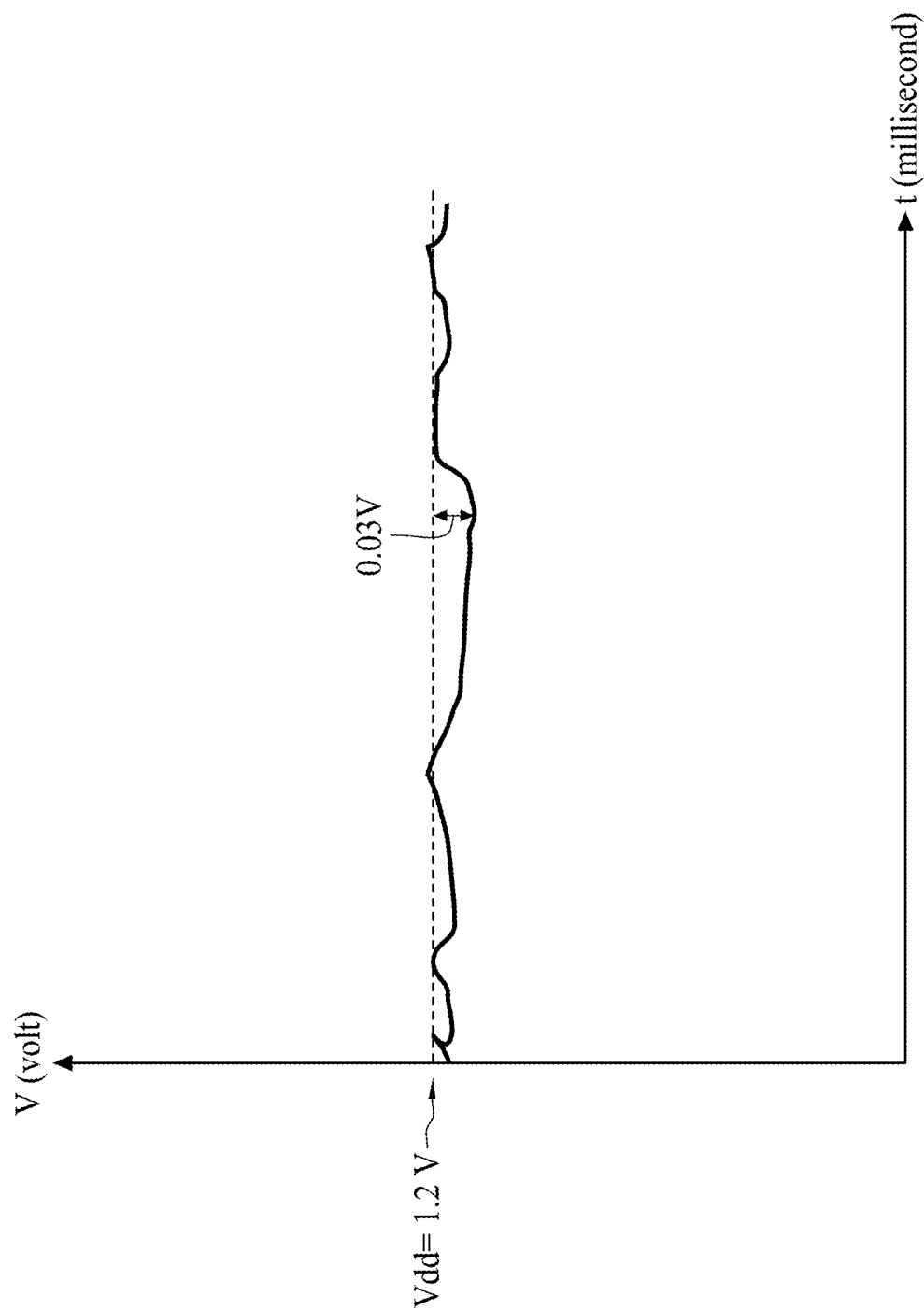
FIG. 4 is a schematic plot showing a relationship between a test supply voltage (V) and time (t) during operation of the test equipment in FIG. 3, in accordance with some embodiments of the present disclosure.

FIG. 4 is a schematic plot showing a relationship between a test supply voltage (V) and time (t) during operation of the test equipment E1 in FIG. 3, in accordance with some embodiments of the present disclosure. As shown in FIG. 4, the x axis represents time (milliseconds) and the y axis represents the test supply voltage Vdd (volts). The horizontal dashed line shows an exemplary test supply voltage Vdd of 1.2 V applied to the DUT 70. In general, during the test process, the deviation of the test supply voltage Vdd from 1.2 V is less than 30 mV. That is, variation of the test supply voltage Vdd is generally small when a specific test supply voltage Vdd is set.

Figure 5:
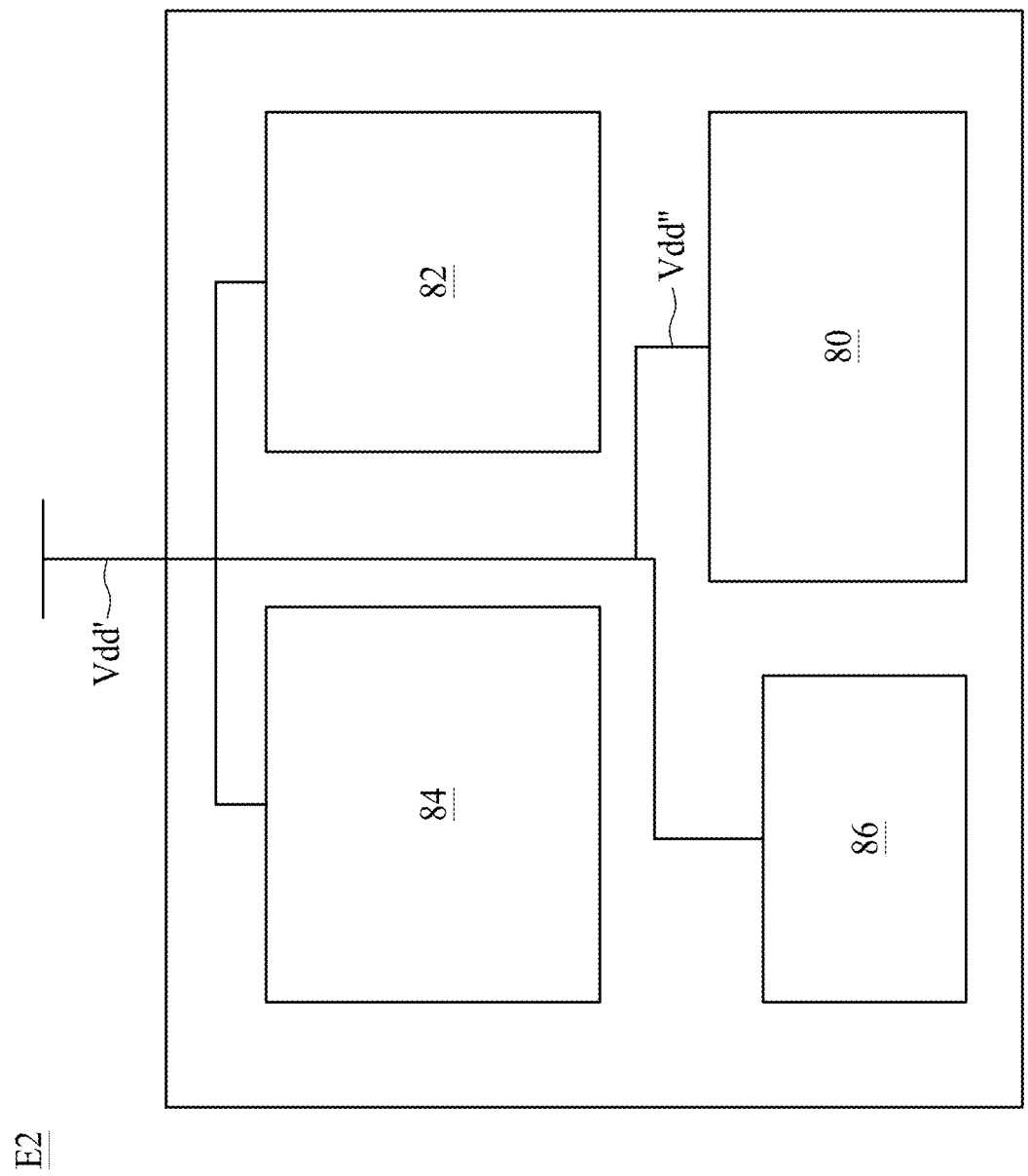
FIG. 5 is a schematic block diagram showing an electronic device, in accordance with some embodiments of the present disclosure.

However, power supply systems in ATEs and real-world electronic devices are significantly different because the power in electronic devices may be distributed to several electronic components operating simultaneously. For example, FIG. 5 is a schematic block diagram showing an electronic device E2, in accordance with some embodiments of the present disclosure. In some embodiments, the electronic device E2 may comprise a plurality of electronic components such as a memory chip 80, a central processing unit (CPU) 82, a cache memory 84 and a graphics card 86. In some embodiments, the electronic device E2 is provided with a supply voltage Vdd' and the supply voltage Vdd' may be distributed to all the aforementioned electronic components at the same time. Therefore, in actual use of the electronic device E2, only a partial supply voltage Vdd" shunted from the supply voltage Vdd' is used to power the memory chip 80. Generally, different electronic components have varying levels of power consumption in different operating modes. For example, when in a standby mode, the CPU 82 consumes a small amount of power, while in a normal operation mode, the CPU 82 requires a large amount of power. As a result, the partial supply voltage Vdd" supplied to the memory chip 80 may fluctuate, especially when other electronic components switch their operating modes. Compared with the test supply voltage Vdd applied to the memory DUT 70 in FIG. 3, the partial supply voltage Vdd" applied to the memory chip 80 is relatively unstable.

Figure 6:
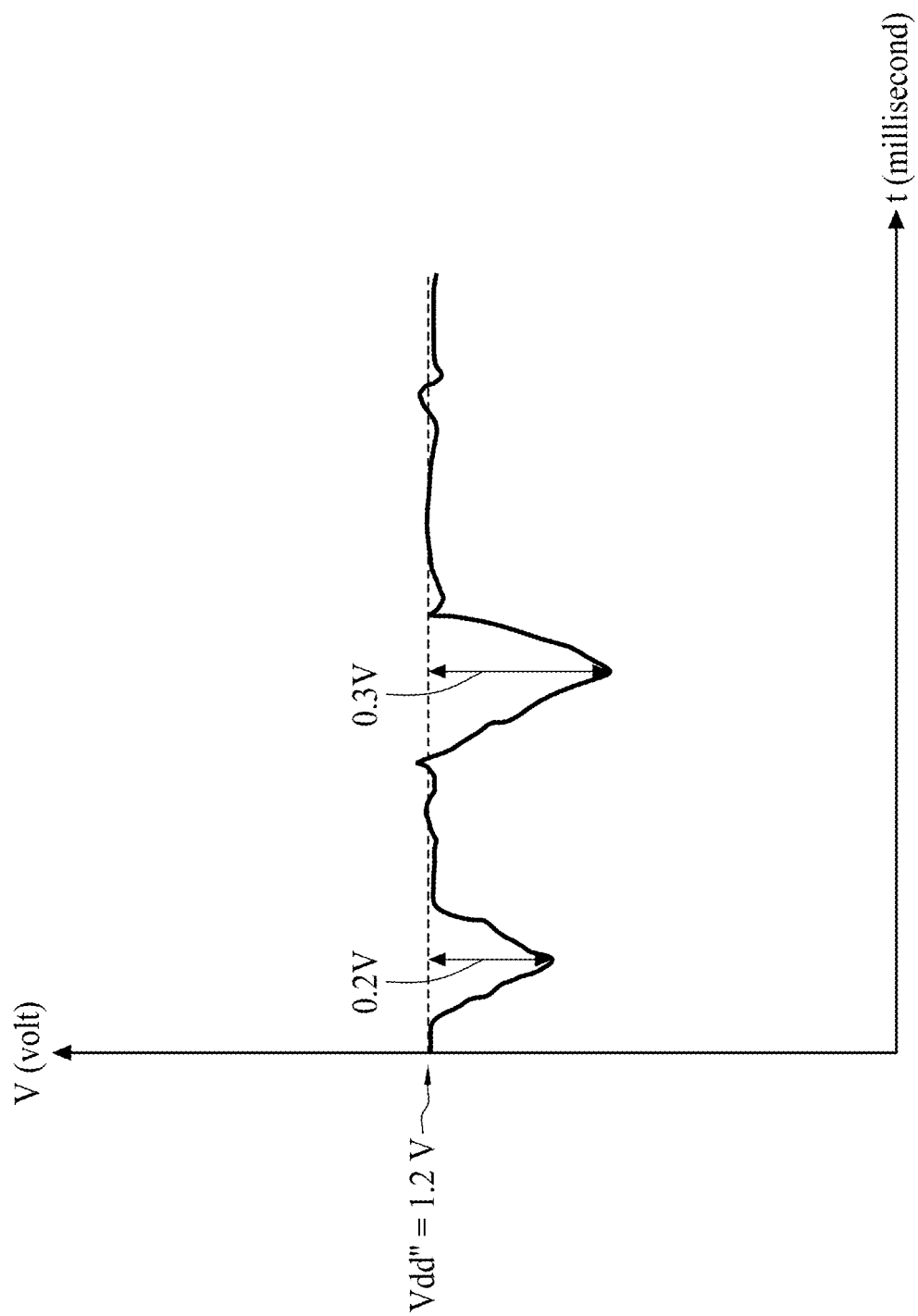
FIG. 6 is another schematic plot showing a relationship between a supply voltage (V) and time (t) during operation of the electronic device in FIG. 5, in accordance with some embodiments of the present disclosure.

FIG. 6 is another schematic plot showing a relationship between a supply voltage (V) and time (t) during operation of the electronic device E2 in FIG. 5, in accordance with some embodiments of the present disclosure. As shown in FIG. 6, the horizontal dashed line shows an exemplary partial supply voltage Vdd" of 1.2 V applied to the memory chip 80. The partial supply voltage Vdd" may vary with time, but compared with the test supply voltage Vdd in FIG. 4, the partial supply voltage Vdd" varies much more significantly. In some cases, the partial supply voltage Vdd" may abruptly drop to, for example, 1.0 V or 0.9 V. Occasionally, the partial supply voltage Vdd" may spike and exceed 1.2 V. Since some memory devices are very sensitive to sudden voltage variations, the variation of 200 or 300 mV in the partial supply voltage Vdd" applied to the memory chip 80 in the electronic device E2 may result in signal distortion or malfunction of the memory chip 80.

Conventional ATEs cannot accurately test such sudden voltage variations in the power supply because the ATE normally provides a relatively stable power supply. In a simulation mode, the supply voltage of an ATE does not drop or rise fast enough. Therefore, conventional ATEs may be unable to screen out problematic memory chips during the testing stage.

Figure 7:
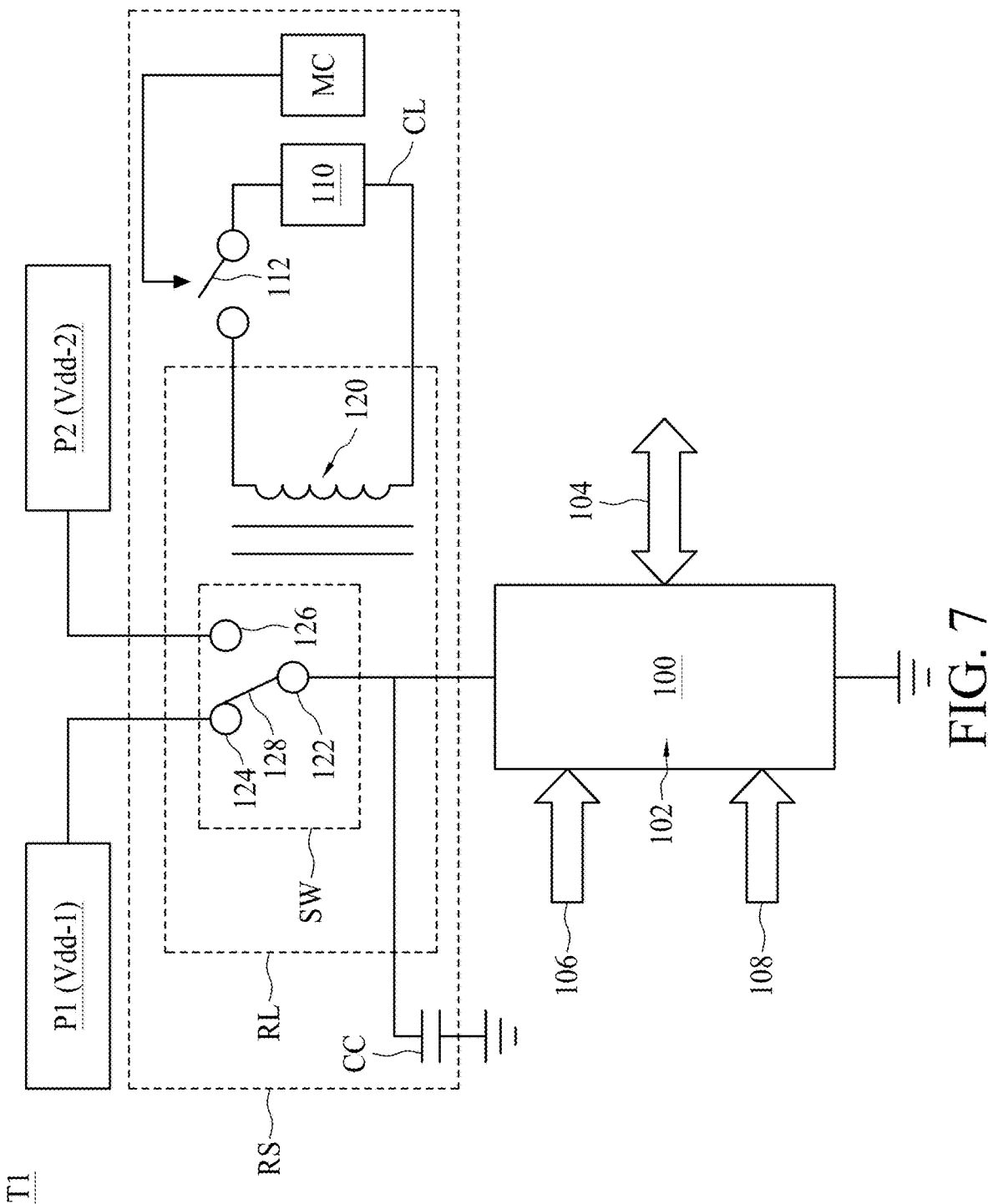
FIG. 7 is a schematic diagram showing a functional test equipment, in accordance with some embodiments of the present disclosure.

The present disclosure provides a functional test equipment, which is a test fixture used in the verification of memory chips. FIG. 7 is a schematic diagram showing a functional test equipment T1, in accordance with some embodiments of the present disclosure. In some embodiments, the functional test equipment T1 mainly includes a landing site 100, a relay system RS, a first power supply P1 and a second power supply P2. In some embodiments, the functional test equipment T1 is provided with a plurality of data lines 104, a plurality of address lines 106 and a plurality of control lines 108. In some embodiments, a DUT 102 may be placed on the landing site 100 in the functional test equipment T1 to determine whether the DUT 102 meets device specifications. In addition, the DUT 102 may be electrically coupled to the data lines 104, the address lines 106 and the control lines 108 during the test. In some embodiments, the DUT 102 may be, but is not limited to, a memory chip such as a DDRx SDRAM.

Figure 11:
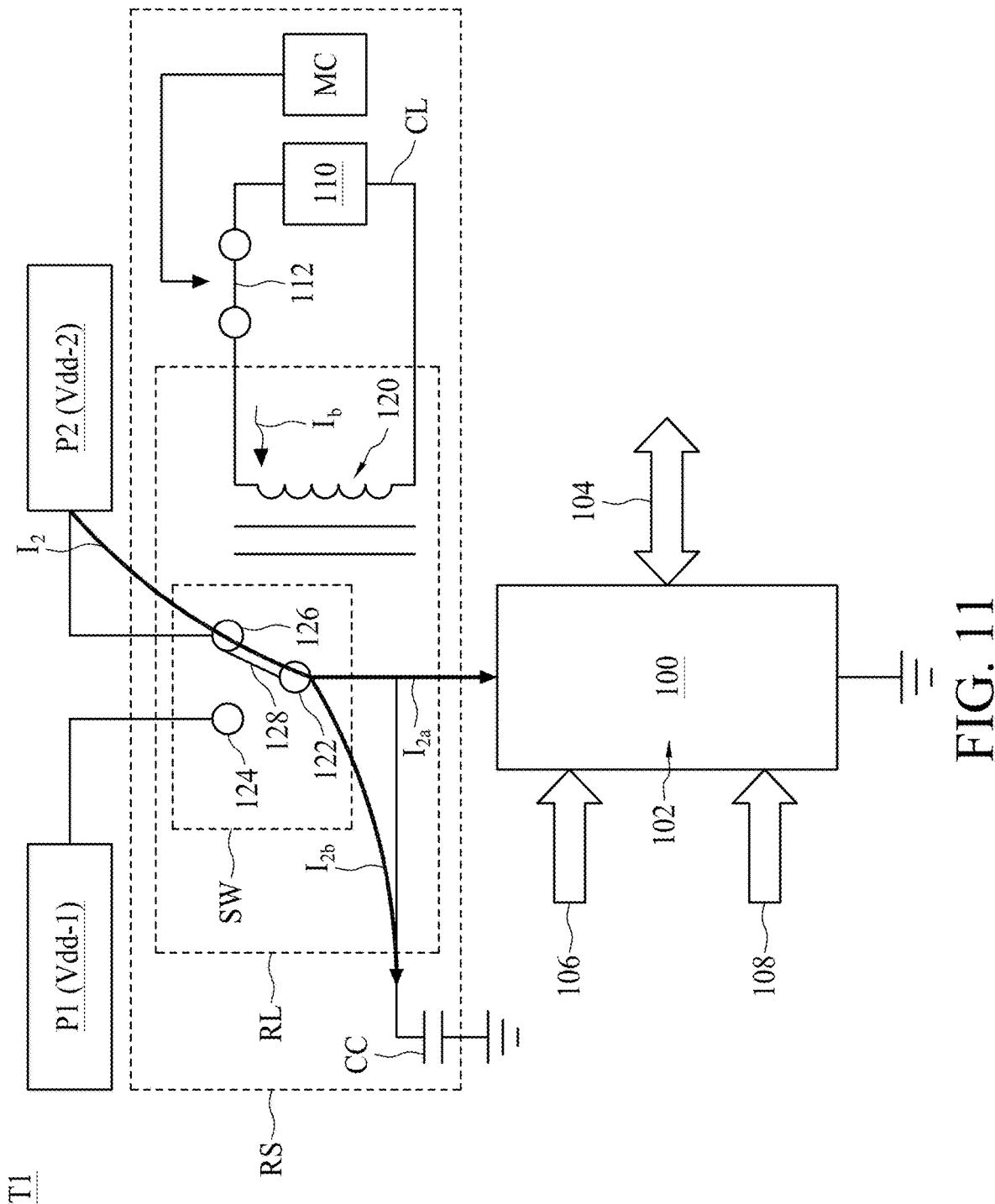

Referring to FIG. 7, the relay system RS is electrically coupled to the landing site 100. In some embodiments, the relay system RS at least includes a relay switch SW, a relay circuit CL magnetically coupled to the relay switch SW for controlling operations of the relay switch SW, and a power management capacitor CC electrically connected to the relay switch SW and the DUT 102. Specifically, the relay switch SW and the relay circuit CL are electrically isolated from each other such that current cannot flow between the relay switch SW and the relay circuit CL. In some embodiments, the relay switch SW may be a single-pole-double-throw (SPDT) type switch that includes a common (COM) contact 122, a normally-closed (NC) contact 124, a normally-open (NO) contact 126 and a switch arm 128, wherein the switch arm 128 is spring-loaded by the COM contact 122. In some embodiments, the relay circuit CL at least includes a power source 110, a control switch 112, a magnetizing coil 120, and a microcontroller MC. In some embodiments, the power source 110 may be a direct-current (DC) power source that provides power at, for example, 3 V. Moreover, the microcontroller MC is used to switch the control switch 112 between closed and open, which in turn determines whether the magnetizing coil 120 is energized or not. In some embodiments, the magnetizing coil 120 and the relay switch SW magnetically coupled thereto form a relay RL in a relay system RS. In some embodiments, the relay RL is a normally-closed relay, i.e., the relay switch SW is normally at a closed state. Specifically, before the relay circuit CL becomes a closed circuit, there is no current flowing through the magnetizing coil 120. Because it is not energized, the magnetizing coil 120 has no influence on the relay switch SW. Therefore, the relay switch SW is in a first closed state, wherein the switch arm 128 connects the COM contact 122 to the NC contact 124 when the magnetizing coil 120 is not energized, as shown in FIG. 7. When energized, the magnetizing coil 120 becomes an electromagnet that generates an axial magnetic field (not shown) to magnetically pull the switch arm 128 of the relay switch SW to connect the COM contact 122 to the NO contact 126, as shown in FIG. 11. As a result, the relay switch SW is brought into a second closed state. Once deenergized, the magnetic field generated by the magnetizing coil 120 disappears, and the switch arm 128 returns to its original position. In some embodiments, the relay switch SW is in the first closed state when the relay circuit CL is an open circuit and the relay switch SW is in the second closed state when the relay circuit CL is a closed circuit. In some embodiments, the microcontroller MC may be electrically coupled to the control switch 112 and used to control an interval of an on state or off state of the control switch 112. In addition, instructions may be given to the microcontroller MC to control a duration of the open or closed state of the relay switch SW according to the interval of the "on" state or "off" state of the control switch 112.

Referring again to FIG. 7, in some embodiments, the first power supply P1 and the second power supply P2 are connected to the relay system RS and electrically coupled to the landing site 100 via the relay system RS. Specifically, the NC contact 124 and the NO contact 126 are respectively connected to the first power supply P1 and the second power supply P2, and the COM contact 122 is connected to the landing site 100. Therefore, when the DUT 102 on the landing site 100 is being tested, the DUT 102 may be electrically coupled to the first power supply P1 or the second power supply P2 according to the control of the relay system RS. In some embodiments, the first power supply P1 may provide a first supply voltage Vdd-1 to the DUT 102 and the second power supply P2 may provide a second supply voltage Vdd-2 to the DUT 102. In some embodiments, the first supply voltage Vdd-1 may be greater than or less than the second supply voltage Vdd-2.

Still referring to FIG. 7, in some embodiments, one terminal of the power management capacitor CC is connected to the common contact 122 and the DUT 102, and the other terminal of the power management capacitor CC is grounded. When the relay switch SW mechanically changes between the first closed state and the second closed state, there is an instant during which the COM contact 122 is not connected to either the NC contact 124 or the NO contact 126, i.e., the relay switch SW is substantially in an open state, which could cause the DUT 102 to be powered off. In some embodiments, a duration of the relay switch SW operated in the open state is less than a duration of the relay switch SW operated in the first closed state the second closed state.

Therefore, the power management capacitor CC electrically coupled to the COM contact 122 is required to maintain a basic power supply to the DUT 102 while the relay switch SW changes between the first closed state and the second closed state. In some embodiments, when the switch arm 128 connects the COM contact 122 to the NC contact 124, i.e., when the DUT 102 is electrically coupled to the first power supply P1, the power management capacitor CC is charged by the first power supply P1. In some embodiments, when the switch arm 128 connects the COM contact 122 to the NO contact 126, i.e., when the DUT 102 is electrically coupled to the second power supply P2, the power management capacitor CC is charged by the second power supply P2. In some embodiments, during moment at which the switch arm 128 does not connect the COM contact 122 to either the NC contact 124 or the NO contact 126, the power management capacitor CC discharges to power the DUT 102. As a result, the very short moment at which there is no power supply to the DUT 102 may be avoided. In some embodiments, the capacitance of the power management capacitor CC may be obtained according to the formula:

$$\tau = RC,$$

wherein $\tau$ represents the time constant, R represents the resistance (which mainly comes from the DUT 100) and C represents capacitance of the power management capacitor CC. In some embodiments, the power management capacitor CC may have a capacitance of between about 22 and about 220 microfarads (µF), which is sufficient to power the DUT 102.

Figure 8:
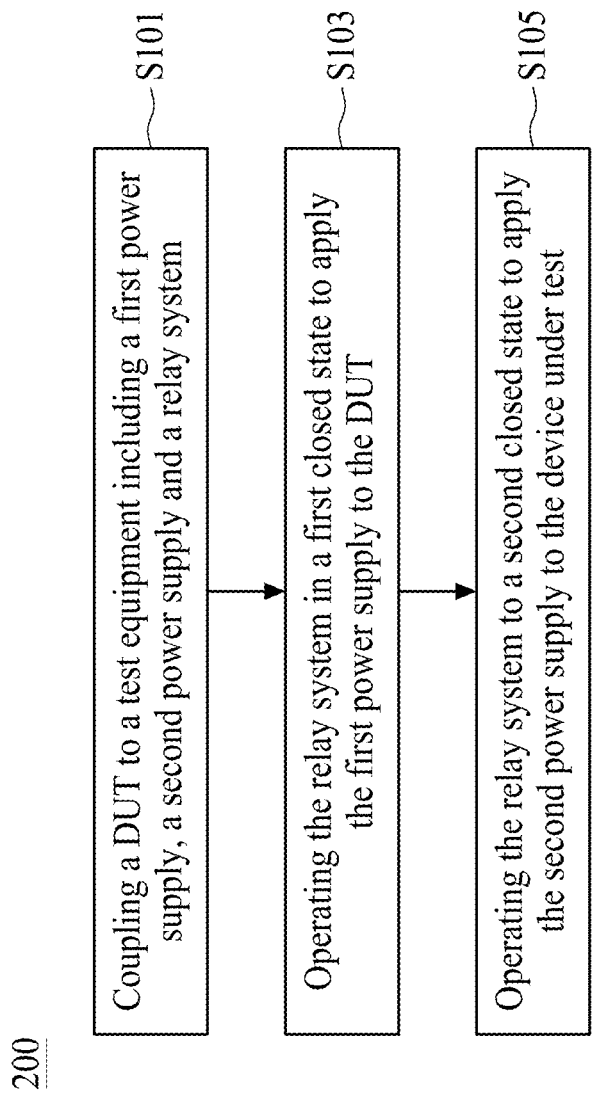
FIG. 8 is a flow diagram showing a test method using the functional test equipment in FIG. 7, in accordance with some embodiments of the present disclosure.

FIG. 8 is a flow diagram showing a test method 200 using the functional test equipment T1 in FIG. 7, in accordance with some embodiments of the present disclosure. FIG. 9 to FIG. 12 are schematic diagrams showing different operational states of the functional test equipment T1, in accordance with some embodiments of the present disclosure. Referring to FIG. 8, the test method 200 begins with step S101, in which the DUT 102 is coupled to the functional test equipment T1.

Figure 9:
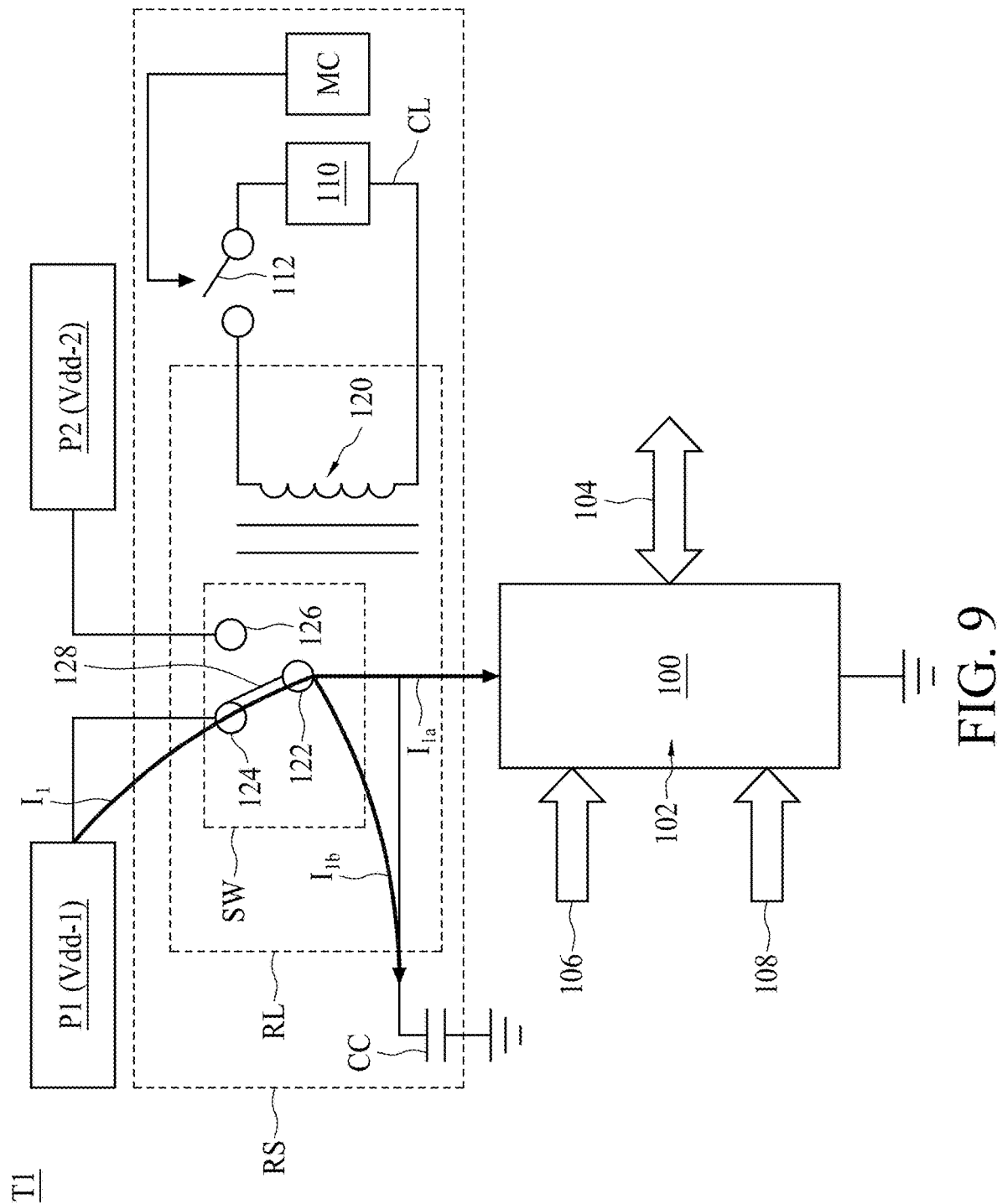
FIG. 9 to FIG. 12 are schematic diagrams showing different operational states of the functional test equipment in FIG. 7, in accordance with some embodiments of the present disclosure.

Referring to FIGS. 8 and 9, at step S103, the relay system RS is brought into a closed state to apply the first power supply P1 to the DUT 102. Specifically, the relay switch SW is kept in a first closed state because the magnetizing coil 120 has no influence on the relay switch SW when the relay circuit CL is open. Therefore, the DUT 102 is connected to the first power supply P1 so that the first supply voltage Vdd-1 is applied to the DUT 102. At such time, the DUT 102 is electrically coupled to the first power supply P1 via the COM contact 122, the switch arm 128 and the NC contact 124. As a result, a first current $I_1$, driven by the potential difference between the first power supply P1 and the DUT 102, flows from the first power supply P1. After passing the relay switch SW, the first current $I_1$ is divided into a current $I_{1a}$ flowing to the DUT 102 and a current $I_{1b}$ flowing to the power management capacitor CC. In some embodiments, the current $I_{1a}$ is used to activate the test of the DUT 102 and the current $I_{1b}$ is used to charge the power management capacitor CC.

Figure 10:
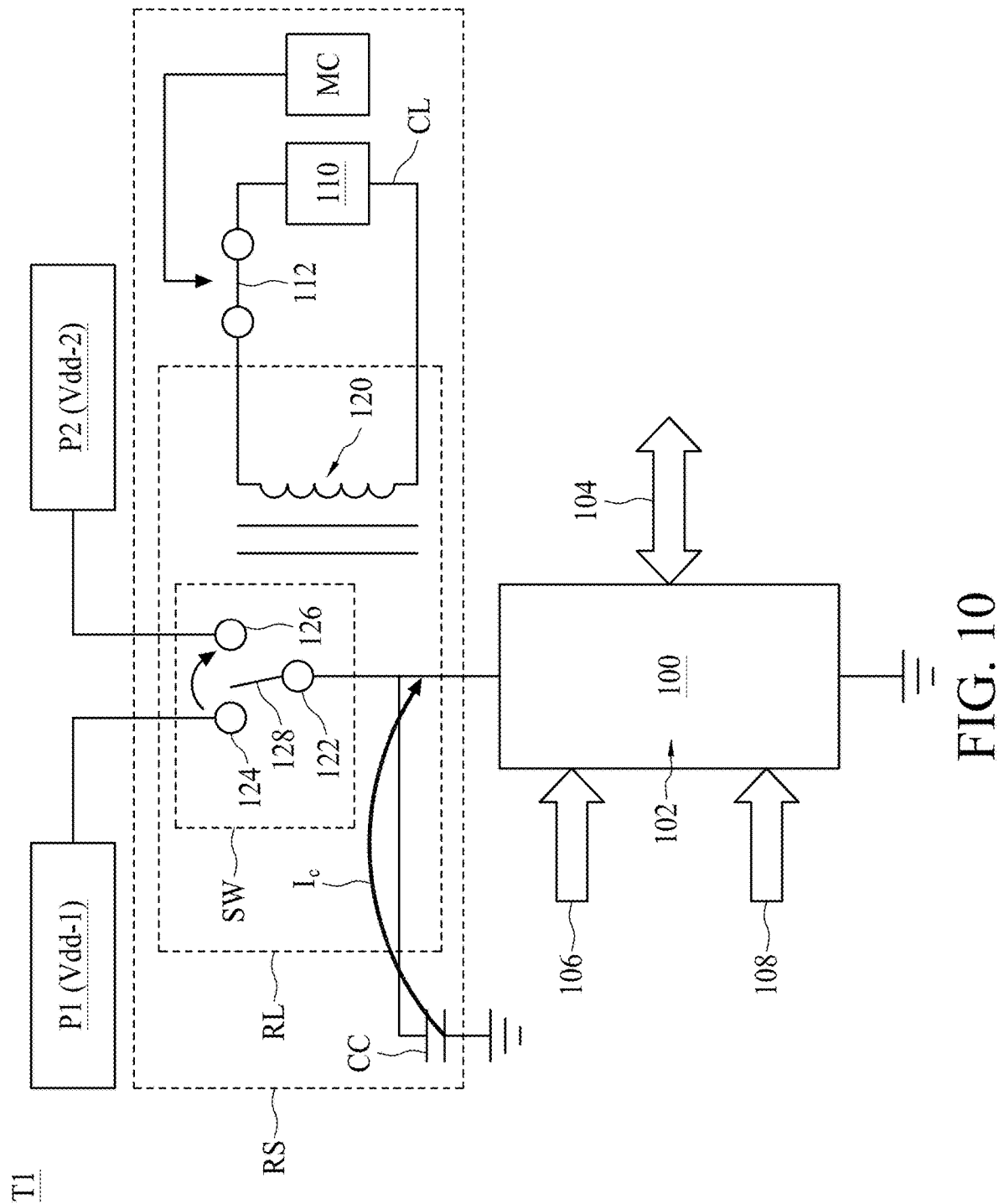

Referring to FIG. 10, the control switch 112 of the relay circuit CL is turned on to magnetically shift the relay switch SW from the first closed state to a second closed state. During a rotation of the switch arm 128, there is a period, lasting tens of milliseconds, in which the COM contact 122 does not connect to either the NC contact 124 or the NO contact 126. At such time, the power management capacitor CC discharges to provide a current $I_c$ to the DUT 102.

Referring to FIGS. 8 and 11, at step S105, the relay system RS is operated in the second closed state to apply the second power supply P2 to the DUT 102. Specifically, the DUT 102 is connected to the second power supply P2 so that the second supply voltage Vdd-2 is applied to the DUT 102. At such time, the DUT 102 is electrically coupled to the second power supply P2 via the COM contact 122, the switch arm 128 and the NO contact 126. As a result, a second current $I_2$, driven by the potential difference between the second power supply P2 and the DUT 102, flows from the second power supply P2. After passing the relay switch SW, the second current $I_2$ is divided into a current $I_{2a}$ flowing to the DUT 102 and a current $I_{2b}$ flowing to the power management capacitor CC. In some embodiments, the current $I_{2a}$ is used to activate the test of the DUT 102 and the current $I_{2b}$ is used to charge the power management capacitor CC.

Figure 12:
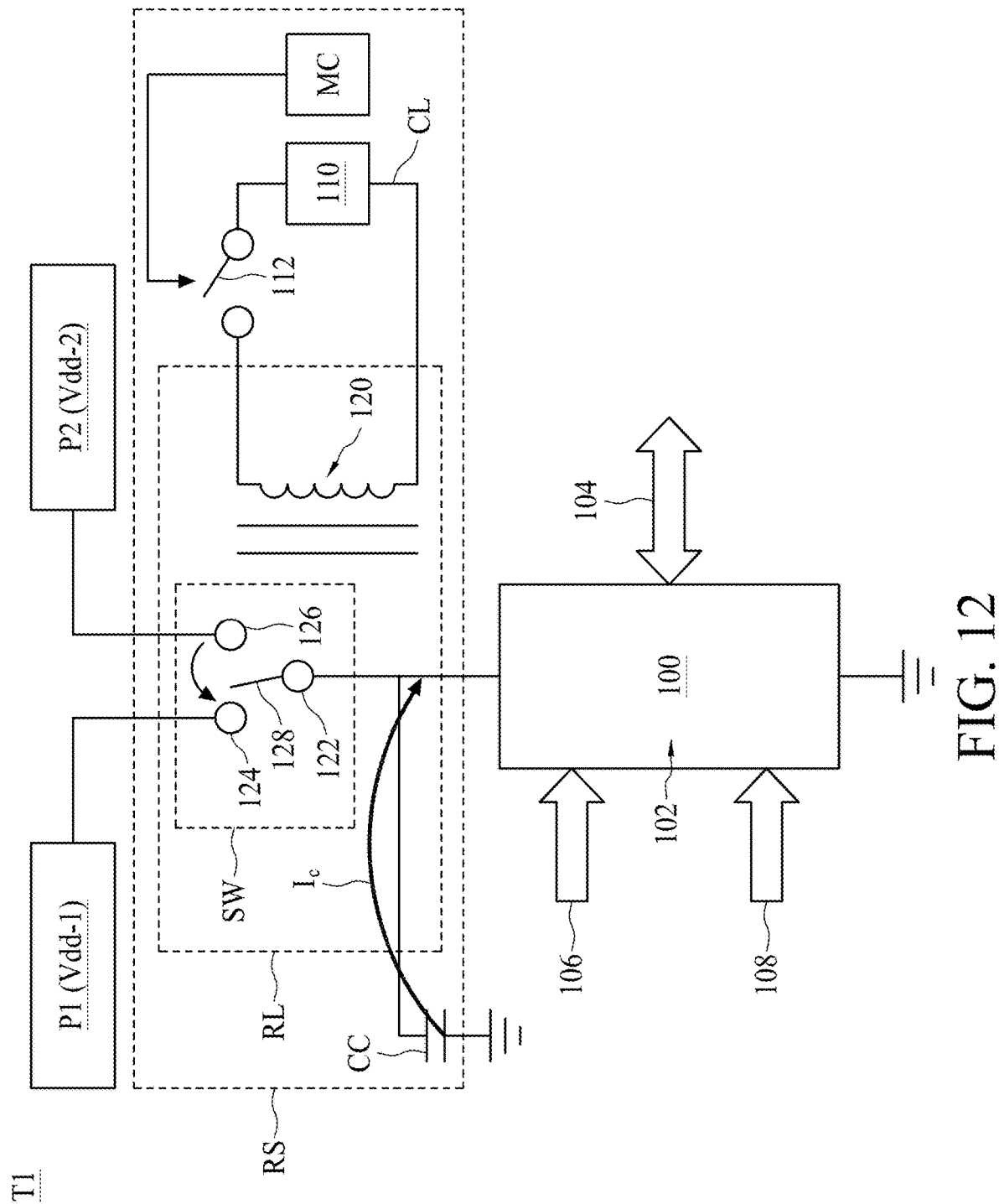

Referring to FIG. 12, the control switch 112 of the relay circuit CL is turned off to cause the relay switch SW to magnetically shift from the second closed state back to the first closed state. At such time, there is also a period, in which the COM contact 122 does not connect to either the NC contact 124 or the NO contact 126. Therefore, the power management capacitor CC again discharges to provide the current $I_c$ to the DUT 102 during the rotation of the switch arm 128. After step S105 shown in FIG. 8, a first cycle including step S101 to step 105 is finished. In some embodiments, the complete test method 200 may include several cycles repeating step S103 to step S105.

Figure 13:
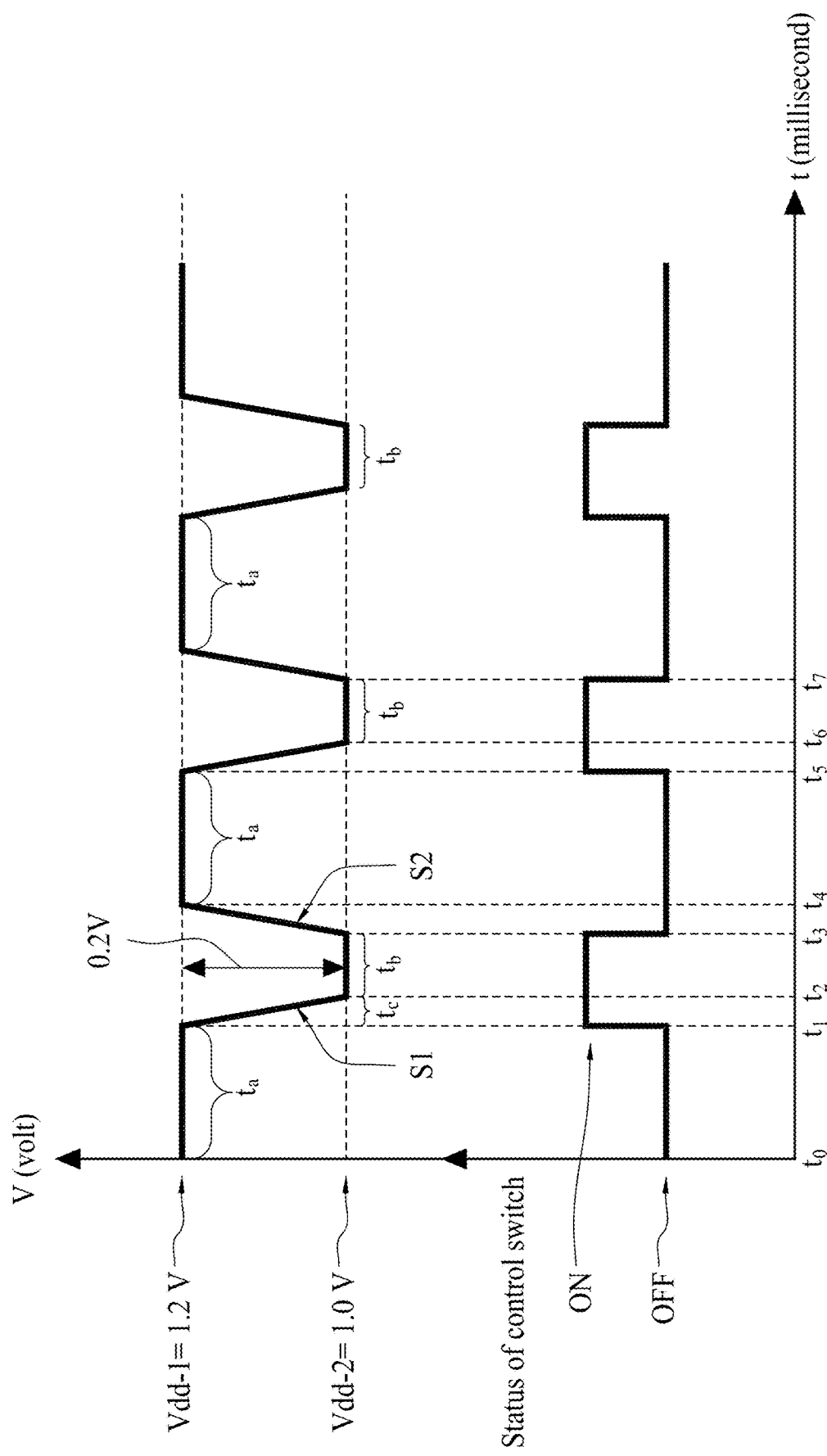
FIG. 13 to FIG. 15 are graphs showing operations of different embodiments of the test method in FIG. 8, in accordance with some embodiments of the present disclosure.
Figure 14:
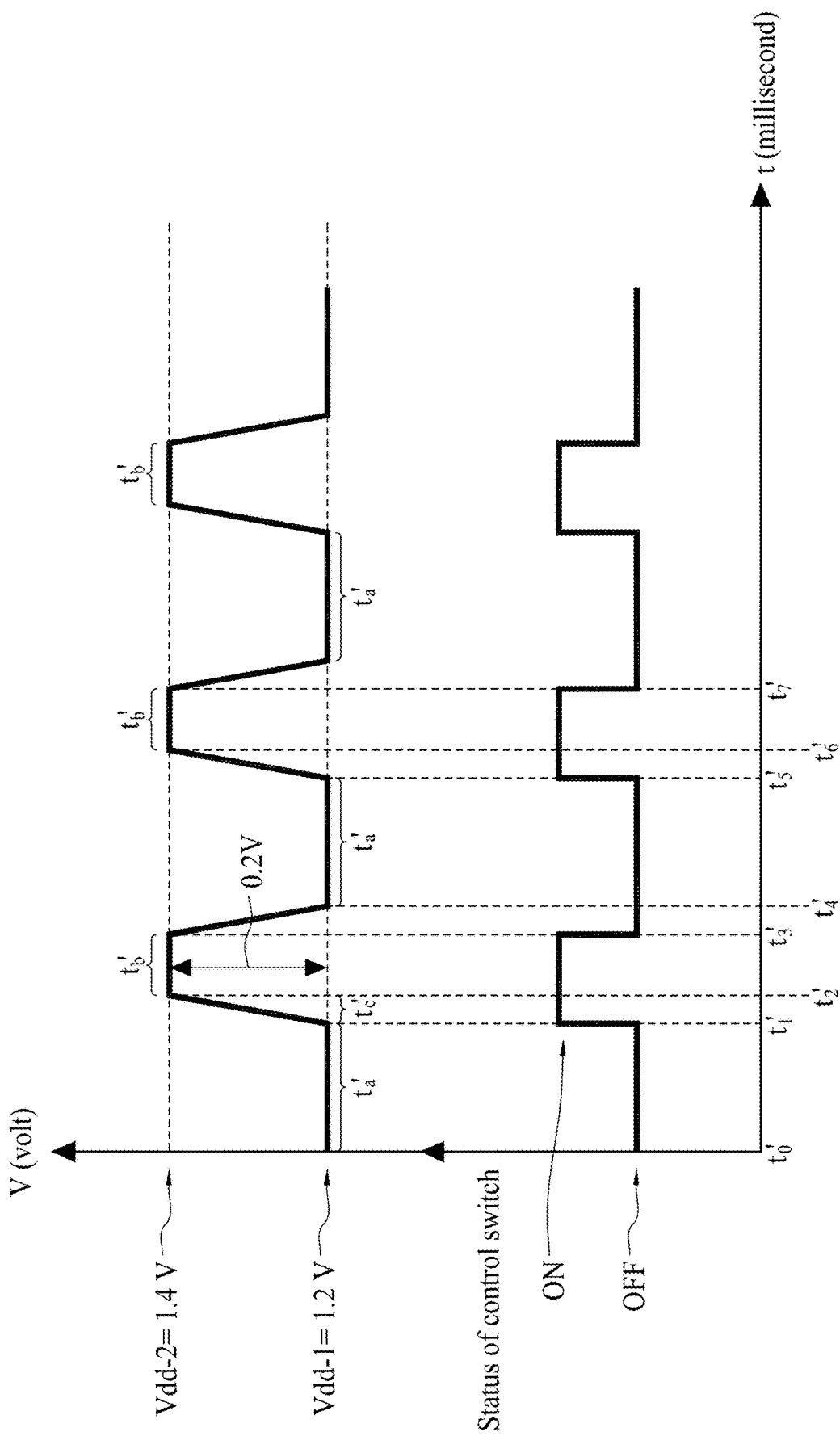
Figure 15:
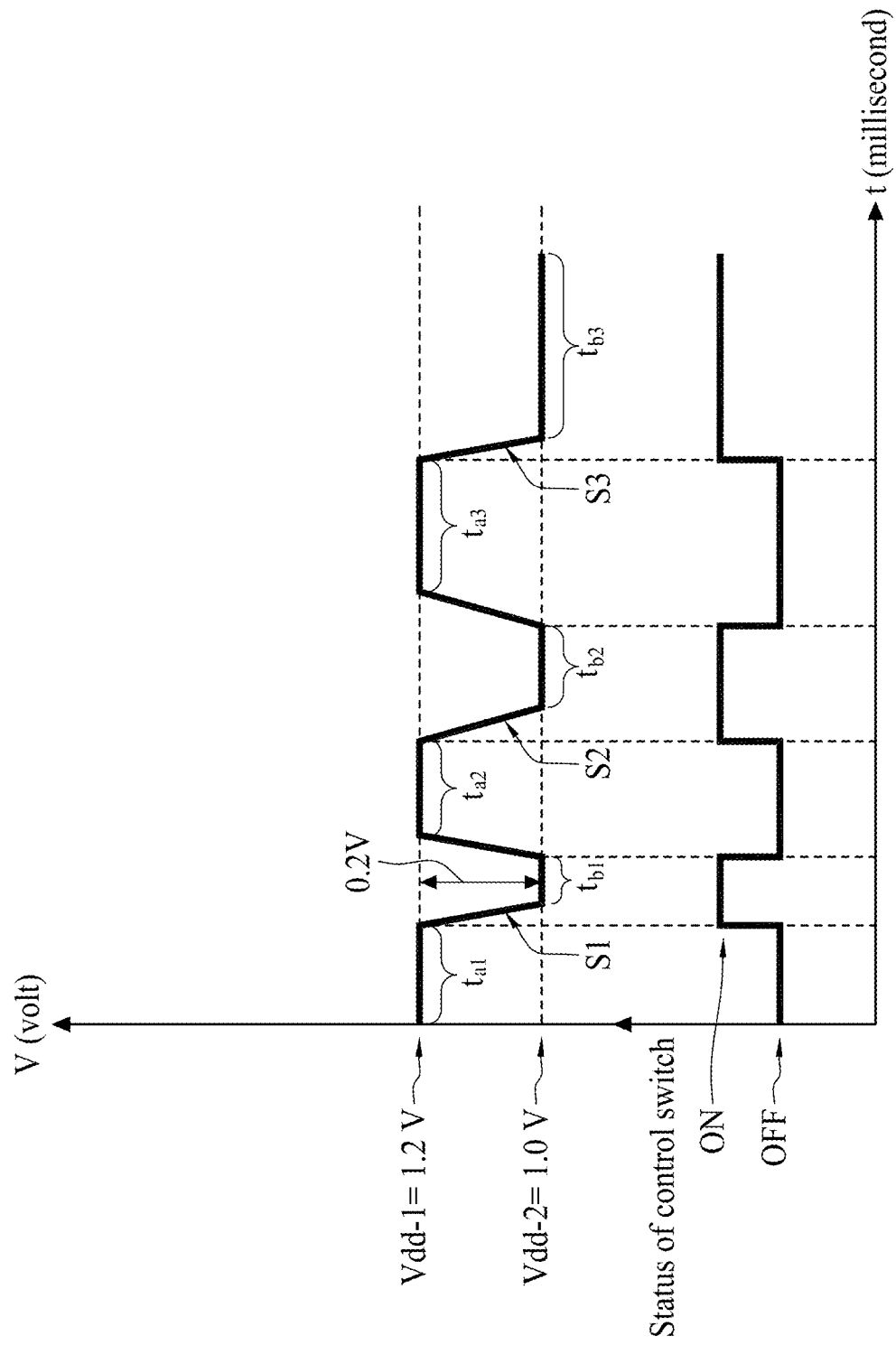

FIG. 13 to FIG. 15 are graphs showing operations of different embodiments of the test method 200 in FIG. 8, in accordance with some embodiments of the present disclosure. Specifically, in FIG. 13 to FIG. 15, y axes show a supply voltage (V) applied to the DUT 102 and a status of the control switch 112, and x axes show time (milliseconds).

Referring to FIG. 13, in some embodiments, the first supply voltage Vdd-1 is set to 1.2 V and the second supply voltage Vdd-2 is set to 1.0 V when the DUT 102 is being tested. The second supply voltage Vdd-2 may be set to any voltage below 1.2 V to examine the degree of power supply drop the DUT 102 can withstand. In some embodiments, the microcontroller MC, as shown in FIG. 7, is electrically coupled to the control switch 112 to control the interval of an on state or an off state of the control switch 112. First, the control switch 112 is turned off at a time $t_0$. The relay switch SW is kept in the first closed state and the voltage of 1.2 V is applied to the DUT 102 during a first high power interval $t_0$ to $t_1$. At the time $t_1$, the control switch 112 is turned on to pull the relay switch SW from the first closed state to the second closed state. The magnetization of the magnetizing coil 120 and the rotation of the switch arm 128 require several milliseconds. The shift of the DUT 102 from being connected to the first power supply P1 to being connected to the second power supply P2 takes a corresponding period of time. As a result, the voltage applied to the DUT 102 is reduced from 1.2 V to 1.0 V at a time $t_2$ shortly after the time $t_1$. In some embodiments, a power drop slope S1, defined as:

$$S1 = \frac{|V_{dd-1} - V_{dd-2}|}{t_2 - t_1},$$

may be adjusted according to test requirements. In addition, the power drop slope S1 may be designed to be large enough, and therefore an abrupt drop in the power supplied to the DUT 102 will be applied to verify the robustness of the DUT 102. During a first low power interval $t_2$ to $t_3$, the control switch 112 is kept on and the relay switch SW is in the second closed state. At the time $t_3$, the control switch 112 is turned off. At a time $t_4$, shortly after the time $t_3$, the voltage applied to the DUT 102 is increased from 1.0 V back to 1.2 V. In some embodiments, a power increase slope S2, defined as:

$$S2 = \frac{|V_{dd-1} - V_{dd-2}|}{t_4 - t_3},$$

may be adjusted according to test requirements. In addition, the power increase slope S2 may be designed to be large enough, and therefore an abrupt increase of power supplied to the DUT 102 will be applied to verify the robustness of the DUT 102. During a second high power interval $t_4$ to $t_5$, the control switch 112 is kept off and the relay switch SW is in the first closed state. At the time $t_5$, the control switch 112 is turned on again. At a time $t_6$, shortly after the time $t_5$, the voltage applied to the DUT 102 is reduced from 1.2 V back to 1.0 V. During a second low power interval $t_6$ to $t_7$, the control switch 112 is kept on and the relay switch SW is in the second closed state. Generally, the aforementioned steps are repeated until the test is finished. As a result, abrupt drops of power supply may be repeatedly applied to test the endurance of the DUT 102.

Still referring to FIG. 13, in some embodiments, the first high power interval $t_0$ to $t_1$, the second high power interval $t_4$ to $t_5$, and the like are of an identical first duration $t_a$. In some embodiments, the first low power interval $t_2$ to $t_3$, the second low power interval $t_6$ to $t_7$, and the like are of an identical second duration $t_b$. In some embodiments, the first duration $t_a$ and the second duration $t_b$ are controlled by the microcontroller MC (shown in FIG. 7). In some embodiments, the first duration $t_a$ is much greater than the second duration $t_b$ since the high power intervals represent periods of normal power supply simulated by the first supply voltage Vdd-1 while the low power intervals represent transitory periods of abnormal power supply simulated by the second supply voltage Vdd-2. In some embodiments, a period, between the first high power interval $t_0$ and $t_1$ and the first low power interval $t_2$ and $t_3$, has a third duration $t_c$ for operating the relay switch SW in the open state. In addition, the third duration $t_c$ is less than the first duration $t_a$ the second duration $t_b$. The alternation of voltage input to the DUT 102 between 1.2 V and 1.0 V according to the present disclosure may simulate a variation of supply voltages experienced by a memory chip in actual use.

Although a power spike is rarely encountered by a memory chip, the method 200 may be used to simulate multiple spikes in the power supplied to the DUT 102. Referring to FIG. 14, in some embodiments, the first supply voltage Vdd-1 is set to 1.2 V and the second supply voltage Vdd-2 is set to 1.4 V when the DUT 102 is being tested. In some embodiments, the second supply voltage Vdd-2 may be set to any voltage over 1.2 V to test the degree of power supply increase the DUT 102 can withstand. First, the control switch 112 is turned off at a time $t_0'$. The relay switch SW is kept in the first closed state and the voltage of 1.2 V is applied to the DUT 102 during a first low power interval $t_0'$ to $t_1'$. At the time $t_1'$, the control switch 112 is turned on to pull the relay switch SW from the first closed state to the second closed state. As a result, the voltage applied to the DUT 102 is increased from 1.2 V to 1.4 V at a time $t_2'$ shortly after the time $t_1'$. During a first high power interval $t_2'$ to $t_3'$, the control switch 112 is kept on and the relay switch SW is in the second closed state. At the time $t_3'$, the control switch 112 is turned off. At a time $t_4'$, shortly after the time $t_3'$, the voltage applied to the DUT 102 is reduced from 1.4 V back to 1.2 V. During a second low power interval $t_4'$ to $t_5'$, the control switch 112 is kept off and the relay switch SW is in the first closed state. At the time $t_5'$, the control switch 112 is turned on again. At a time $t_6'$, shortly after the time $t_5'$, the voltage applied to the DUT 102 is increased from 1.2 V back to 1.4 V. During a second low power interval $t_6'$ to $t_7'$, the control switch 112 is kept on and the relay switch SW is in the second closed state. Generally, the aforementioned steps are repeated until the test is finished. As a result, abrupt increases of power supply may be repeatedly applied to test the endurance of the DUT 102.

Still referring to FIG. 14, in some embodiments, the first low power interval $t_0'$ to $t_1'$, the second low power interval $t_4'$ to $t_5'$, and the like are of an identical first duration $t_a'$. In some embodiments, the first high power interval $t_2'$ to $t_3'$, the second high power interval $t_6'$ to $t_7'$, and the like are of an identical second duration $t_b'$. In some embodiments, the first duration $t_a'$ and the second duration $t_b'$ are controlled by the microcontroller MC (shown in FIG. 7). In some embodiments, the first duration $t_a'$ is much greater than the second duration $t_b'$.

In some embodiments, the microcontroller MC, shown in FIG. 7, may be given instructions to control durations of high power intervals and low power intervals. For example, the embodiment shown in FIG. 15 is similar to the embodiment shown in FIG. 13, except that the high power intervals (i.e., intervals in which a voltage of 1.2 V is applied to the DUT 102) are of different durations such as $t_{a1}$, $t_{a2}$, $t_{a3}$ and the like and the low power intervals (i.e., intervals in which a voltage of 1.0 V is applied to the DUT 102) are of different durations such as $t_{b1}$, $t_{b2}$, $t_{b3}$ and the like. In some embodiments, the durations $t_{a1}$, $t_{a2}$, $t_{a3}$ and the like may be the same or different from each other, and the durations $t_{b1}$, $t_{b2}$, $t_{b3}$ and the like may be the same or different from each other. As a result, the combination of the first durations $t_{a1}$, $t_{a2}$, $t_{a3}$ and the second durations $t_{b1}$, $t_{b2}$, $t_{b3}$ and the like forms a more realistic simulation when the DUT 102 is under test. In addition, according to the microcontroller MC, the DUT 102 may be tested according to a simulation of an unstable power supply to a memory chip when the memory chip is serving multiple functions simultaneously.

Conventional ATEs are unable to precisely reflect voltage variation in the power supply input to the device under test, thus failing to screen out problematic devices under test at the stage of verification. The present disclosure provides a functional test equipment. The functional test equipment mainly includes a relay system and a pair of power supplies. The pair of power supplies provides a pair of different supply voltages to a DUT placed in the functional test equipment. The combination of the relay system and the pair of power supplies performs a test on the DUT to simulate situations a memory chip may encounter in actual use. For example, the pair of different supply voltages input to the DUT simulates a variation of supply voltages encountered by the memory chip. In the test, abrupt drops of the power supplied to the DUT may be applied to verify the robustness or endurance of the DUT. Therefore, a more realistic simulation when the DUT is being tested can be realized according to the present disclosure. In addition, a microcontroller in the relay system may function as a timing programmer, which controls durations of periods in which the power supplies are applied to the DUT.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A functional test equipment for a device under test, comprising:
    a first power supply configured to generate a first supply voltage;
    a second power supply configured to generate a second supply voltage different from the first supply voltage; and
    a relay system configured to electrically couple the first power supply or the second power supply to the device under test, wherein the first supply voltage is applied to the device under test for a first duration and the second supply voltage is applied to the device under test for a second duration less than the first duration;
    wherein the relay system comprises a relay comprised of a relay switch and a magnetizing coil magnetically coupled to the relay switch, and a microcontroller configured to control operations of the relay switch;
    wherein the relay system further comprises a power source and a control switch interposed between the power source and the magnetizing coil, wherein the microcontroller is configured to close or open the control switch to control the operation of the relay switch;
    wherein the functional test equipment further comprises a power management capacitor, wherein one terminal of the power management capacitor is electrically coupled to the relay switch and the device under test, and the other terminal of the power management capacitor is grounded, wherein the power management capacitor is charged by the first supply voltage when the relay system couples the first power supply to the device under test, the power management capacitor is charged by the second supply voltage when the relay system couples the second power supply to the device under test, and the power management capacitor discharges to power the device under test when the relay system does not couple the first power supply or the second power supply to the device under test.

2. The functional test equipment according to claim 1, wherein the functional test equipment is provided with a plurality of data lines, a plurality of address lines and a plurality of control lines to be electrically coupled to the device under test.

3. The functional test equipment according to claim 1, wherein the microcontroller is configured to control a first interval of an off state of the control switch and a second interval of an on state of the control switch.

4. The functional test equipment according to claim 1, wherein the relay switch comprises a common contact electrically coupled to the device under test, a normally-closed contact electrically coupled to the first power supply, a normally-open contact electrically coupled to the second power supply, and a switch arm, wherein the switch arm is spring-loaded by the common contact and connects the common contact to the normally-closed contact.

5. The functional test equipment according to claim 4, wherein the first supply voltage is applied to the device under test when the switch arm connects the common contact to the normally-closed contact.

6. The functional test equipment according to claim 4, wherein the second supply voltage is applied to the device under test when the switch arm connects the common contact to the normally-open contact.

7. The functional test equipment according to claim 4, wherein the power management capacitor is charged by the first power supply when the switch arm connects the common contact to the normally-closed contact, and the power management capacitor is charged by the second power supply when the switch arm connects the common contact to the normally-open contact.

8. The functional test equipment according to claim 4, wherein the power management capacitor discharges to power the device under test when the switch arm does not connect the common contact to either the normally-closed contact or the normally-open contact.

9. The functional test equipment according to claim 4, wherein the power management capacitor has a capacitance of between 20 microfarads and 220 microfarads.

* * * * *